United States Patent
Desor et al.

(10) Patent No.: US 6,226,307 B1
(45) Date of Patent: May 1, 2001

(54) MAGNETIC SWITCH CONTROLLED POWER SUPPLY ISOLATOR AND THYRISTOR COMMUTATING CIRCUIT (75) Inventors: Rainer Desor, Bovenden; Andreas Targsdorf, Klein Schneen, both of (DE); Spencer Merz, Brookline, MA (US); Hubertus Von Bergmann, Irene (ZA)

(73) Assignee: Lambda Physik GmbH, Goettingen (DE)

( * ) Notice: Subject to any disclaimer, the term of this patent is extended or adjusted under 35 U.S.C. 154(b) by 0 days.

(21) Appl. No.: 09/432,348

(22) Filed: Nov. 2, 1999

Related U.S. Application Data (63) Continuation of application No. 08/842,578, filed on Apr. 15, 1997, now Pat. No. 6,020,723.
(60) Provisional application No. 60/037,942, filed on Feb. 14, 1997.

(51) Int. Cl.$^7$ ........................................................ H01S 3/00
(52) U.S. Cl. .................................. 372/37; 372/38; 372/25
(58) Field of Search ................................. 372/37, 38, 25

(56) References Cited

U.S. PATENT DOCUMENTS

| | | |
|---|---|---|
| 4,718,072 | 1/1988 | Marchetti et al. . |
| 4,928,020 | 5/1990 | Birx et al. . |
| 5,142,166 * | 8/1992 | Brix ........................................ 307/419 |
| 5,177,754 * | 1/1993 | Ball et al. ................................ 372/38 |
| 5,181,217 * | 1/1993 | Sato et al. ................................ 372/38 |
| 5,305,338 * | 4/1994 | Wakata et al. ........................... 372/38 |
| 5,313,481 * | 5/1994 | Cook et al. .............................. 372/37 |
| 5,315,611 * | 5/1994 | Ball et al. ................................ 372/38 |
| 5,319,665 | 6/1994 | Birx . |
| 5,729,562 | 3/1998 | Birx et al. . |
| 5,754,579 * | 5/1998 | Mizoguchi et al. ..................... 372/38 |
| 5,914,974 * | 6/1999 | Partlo et al. ............................. 372/38 |
| 5,936,988 | 8/1999 | Partlo et al. ............................. 372/38 |
| 5,940,421 | 8/1999 | Partlo et al. ............................. 372/38 |
| 5,949,806 | 9/1999 | Ness et al. ............................... 372/38 |
| 5,982,795 * | 11/1999 | Rothwell et al. ....................... 372/37 |
| 6,005,880 * | 12/1999 | Basting et al. .......................... 372/38 |
| 6,020,723 * | 2/2000 | Desor et al. ............................. 372/37 |

FOREIGN PATENT DOCUMENTS

| | | |
|---|---|---|
| 3842492 | 6/1990 | (DE) . |
| WO96/25778 | 1/1996 | (WO) .............................. H01S/3/00 |

OTHER PUBLICATIONS

D. Basting, K. Hohia, E. Albers, H.M. vonBergmann, "Thyratrons with magnetic switches, the key to reliable excimer lasers", *Optoelektronik*, vol. 16, 1984, pp–128–136.

I. Smilanski, S.R. Byron, T.R. Burkes, "Electrical excitation of an XeCl laser using magnetic pulse compression", *Appl. Phys. Letters*, vol. 40, 1982, pp. 547–548.

H.M. vonBergmann, P.H. Swart, Thyristor–driven pulsers for multikilowatt average power lasers, *IEEE Proceedings–B*, vol. 139, No. 2, Mar. 1992.

O. Kobayashi, K. Noda, T. Shimada, M. Obara, "High power repetitive excimer lasers pumped by an all solid state magnetic exciter," *Proceedings SPIE*, vol. 622, High Power and Solid State Lasers (1986), 111–117.

A.L. Keet, M. Groeneboom, "High voltage solid–state pulser for high repetition rate gas laser", 1989, EPE Conference, Aachen.

(List continued on next page.)

*Primary Examiner*—Leon Scott, Jr.
(74) *Attorney, Agent, or Firm*—Andrew V. Smith (57) ABSTRACT

An isolation means used in conjunction with supplying energy to a laser, which isolates a power supply from the pulser circuit, and commutates a switch which activates the discharge of energy to the laser.

28 Claims, 4 Drawing Sheets

OTHER PUBLICATIONS

I. Smilanski, "Reducing thyratron losses in CVL modulator", Conference Record, 19th Power Modulator Conf, 1990, San Diego, CA, pp. 287–289.

W.S. Melville, "The use of saturable reactors as discharge devices for pulse generators", Proceedings of Inst. of Electrical Engineers, Part III, Radio and Communication Engineering, vol. 98, 1951, pp. 1895–207.

Questek, "Magnetic pulse compression for excimer lasers," Technical Note No. 2, May 1983.

T. Shimada, et al., "An all solid-state megnetic switching exciter for pumping excimer lasers," Rev. of Sci. Instrum., vol. 56, 1985.

T. Shimada, "Semiconductor switched magnetic modulator for rep-rate lasers," IEEE Pulse Conference, 1985.

H.J. Baker et al., "An efficient laser pulser using ferrite magnetic switches." IOP Publishing, pp. 218–224, 1988.

H.J. Baker et al., "Magnetic Switching Circuits for Variable High Voltage Pulse Delays and Gas-Laser Synchronisation", *J. Phys. E:Sci. Instrum*, 19, 1986, pp. 149–152.

Birx et al., "Regulation and Drive System for High Rep-Rate Magnetic Pulse Compressors", *Proceedings 15th Power Modulator Symposium*, pp. 15–21.

\* cited by examiner

MAGNETIC SWITCH CONTROLLED POWER SUPPLY ISOLATOR AND THYRISTOR COMMUTATING CIRCUIT

PRIORITY

This application is a continuation of priority to U.S. patent application Ser. No. 08/842,576, filed Apr. 15, 1997, under 37 C.F.R. §1.53(b) now U.S. Pat. No. 6,020,723 correspondingly the benefit of priority to U.S. provisional patent application No. 60/037,942, filed Feb. 14, 1997 now U.S. Pat. No. 5,985,355.

BACKGROUND OF THE INVENTION

1. Field of the Invention

The present invention relates to a system which provides energy pulses in an excimer laser system, where the circuit for the providing the energy pulse isolates the power supply of the system so that energy reflected back from the laser and pulsing circuit does not damage the power supply.

2. Description of Related Prior Art

Pulsing circuits, or pulsers, employed for the excitation of excimer lasers have historically used thyratrons and spark gaps as switching elements, because of the extremely demanding switch parameters required for the excitation of these lasers. Electrode voltages of the order of several tens of kV with voltage rise times of typically 100 ns have to be applied to the laser electrodes in order to generate stable glow discharges and achieve efficient lasing. Under direct switching conditions this requires switched currents of 10 to 20 kA with current rise times of up to $10^4$ A/$\mu$s.

Gas phase switches, spark gaps and large thyratrons can fulfill these demanding operating conditions. For long switch lifetimes and operation at high repetition rates, however, spark gaps are not suitable and only thyratrons can be employed. In order to achieve thyratron lifetimes of $>10^9$ shots, as required in industrial applications, the thyratron has to be augmented by magnetic pulse compression techniques to reduce the energy transfer times and with it peak current and rates of rise of current. See, D. Basting, K. Hohia, E. Albers and H. M. von Bergmann, 1984, "Thyratrons with magnetic switches, the key to reliable excimer lasers," *Optoelektronik*, Volume 16, 1984, pp. 128–136; and I. Smilanski, S. R. Byron and T. R. Burkes, 1982, "Electrical excitation of an XeCl laser using magnetic pulse compression," *Appl. Phys. Letters*, Volume 40, 1982, pp. 547–548. Thyratrons can be very reliable and are widely employed in commercial high power excimer lasers. However, they do suffer from a limited service life, which significantly adds to the operating costs of the laser, and are subject to occasional misfires, especially towards the end of their useful lifetime. Several commercial applications, namely lithography and wafer production, can not tolerate any misfires, significantly adding to the already demanding switch requirements.

Recently several all-solid-state switched circuits have been developed which can be used in place of a thyratron. See, H. M. von Bergmann and P. H. Swart, 1992, "All-solid-state pulsers for high repetition rate multi-kilowatt lasers," *IEEE Proceedinqs-B*, Vol. 139, 123–130; and O. Kobayashi, K. Noda, T. Shimada and M. Obara, "High power repetitive excimer lasers pumped by an all solid state magnetic exciter," *Proceedings SPIE (Society of Photo-Optical Engineers)*, Vol. 622, High Power and Solid State Lasers, 1986, 111–117. Semiconductor switches have the potential of almost unlimited service lifetime, if operated within their safe operational regime. Furthermore, they are not subject to the problem of misfires. On the other hand, operating parameters of semiconductor switches, such as thyristors, GTOs and IGBTs are severely limited in respect of maximum allowable operating voltages and maximum rates of current rise. Typical values of operating voltages are in the range of 1.2 to 3.6 kV with the maximum current rise limited to less than a few hundred A/$\mu$s. The high voltages required for the excitation of excimer lasers can only be achieved by using stacks of multiple series-connected low voltage devices or by employing a high voltage step-up transformer in the circuit.

In order to increase the peak current and the rate of rise of current to an acceptable value, multiple stages of magnetic pulse compression have to be introduced to reduce the pulse duration. Thus, the pulse output by the semiconductor switch, which typically has a switching time of several micro seconds, is modified so that it is suitable to drive the laser. More specifically, electromagnetic pulse compressors of the Melville line type are generally employed to convert the pulse of several microseconds to a pulse on the order 100 ns as is required for stable discharge formation at the laser electrodes for this task. The operation and design of these pulse compressors is described in detail by W. S. Melville, "The use of saturable reactors as discharge devices for pulse generators," Proceedings of the Institution of Electrical Engineers, Part III, Radio and Communication Engineering, Volume 98, 1951, pp. 185–207.

Figure 1:
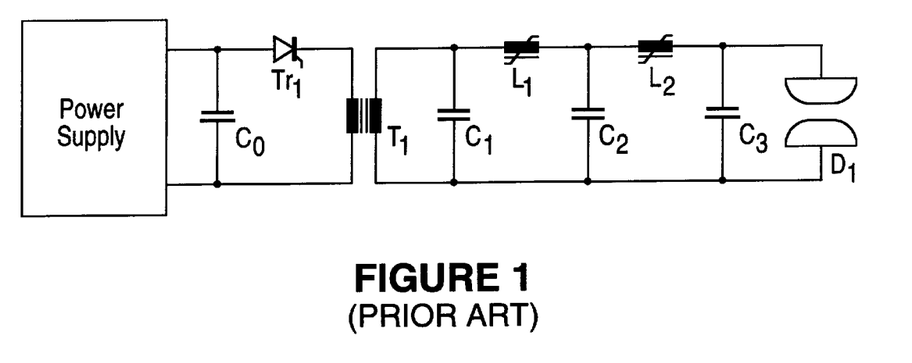
FIG. 1 illustrates a typical all-solid-state switched excimer laser excitation circuit in the prior art.

FIG. 1 shows a typical all-solid-state switched excimer laser excitation circuit. In the prior art the power supply 10, supplies electrical energy which is stored in the capacitor $C_0$. The prior art excitation circuit uses a pulse transformer $T_1$ to step up the relatively low primary voltage of typically 1 to 3 kV across $C_0$, which can be handled by the thyristor $Tr_1$, to the required high output voltage of 20 to 40 kV. Two or more stages of pulse compression, consisting of the transfer loops $C_1$-$L_1$-$C_2$ and $C_2$-$L_2$-$C_3$ are employed to reduce the pulse duration to the required 100 ns over the laser electrodes.

A further drawback limiting the use of high power and high voltage thyristors, which can be employed for the excitation of a high power excimer laser, is their relatively long recovery time. The recovery time is the time required for the switch to go into the nonconducting state, once the current through the switch has been reduced to zero. Recovery times are limited by carrier diffusion times and range from a few tens of $\mu$s to several hundred $\mu$s. Long recovery times can limit the maximum repetition rate at which the switch can be operated. This is especially true, if linear dc charging, e.g., by switched mode power supplies, is employed for the charging of the primary energy storage capacitor $C_0$. It is therefore desirable to apply a negative voltage to the thyristor once the switching process has been completed to decrease the recovery time and prevent a renewed turn-on of the thyristor which can lead to latching once $C_0$ is recharged for the next pulse. This matter, however, is complicated by the fact that power supplies in general, and switched mode power supplies in particular, do not tolerate negative voltages across their output. An isolating circuit element is therefore required to isolate the power supply from the pulser during the switching and negative voltage phase.

Some previous pulser circuits have provided for some isolation by inserting an additional switch between the power supply and the primary energy storage capacitor $C_0$. (The switch does not necessarily have to be solid state, but it is probably preferred.) However, the insertion of such an additional switch increases the complexity of the circuit. See, A. L. Keet and M. Groeneboom, 1989, "High Voltage Solid-State Pulser for High Repetition Rate Gas Laser," EPE Conference, Aachen.

Other pulsers of the prior art use a solid state switching device for transmitting energy to the pulse compression circuit and for providing for recovery of the energy reflected by the pulse compression circuit. See, for example, International Application, WO 96/25778, Inventors Daniel L. Birx et al. The later circuit has a significant drawback since it does not provide for isolation of the power supply or for using the negative charge to commutate the triggering switch.

SUMMARY OF THE INVENTION

In part, this invention provides an actively controlled circuit element which serves to isolate the power supply from the pulser during the transfer of energy to laser, and to utilize a portion of the energy reflected by the pulse compression circuit and the laser to commutate a switch used to activate the transfer of energy to the laser.

DETAILED DESCRIPTION OF THE INVENTION

Figure 2:
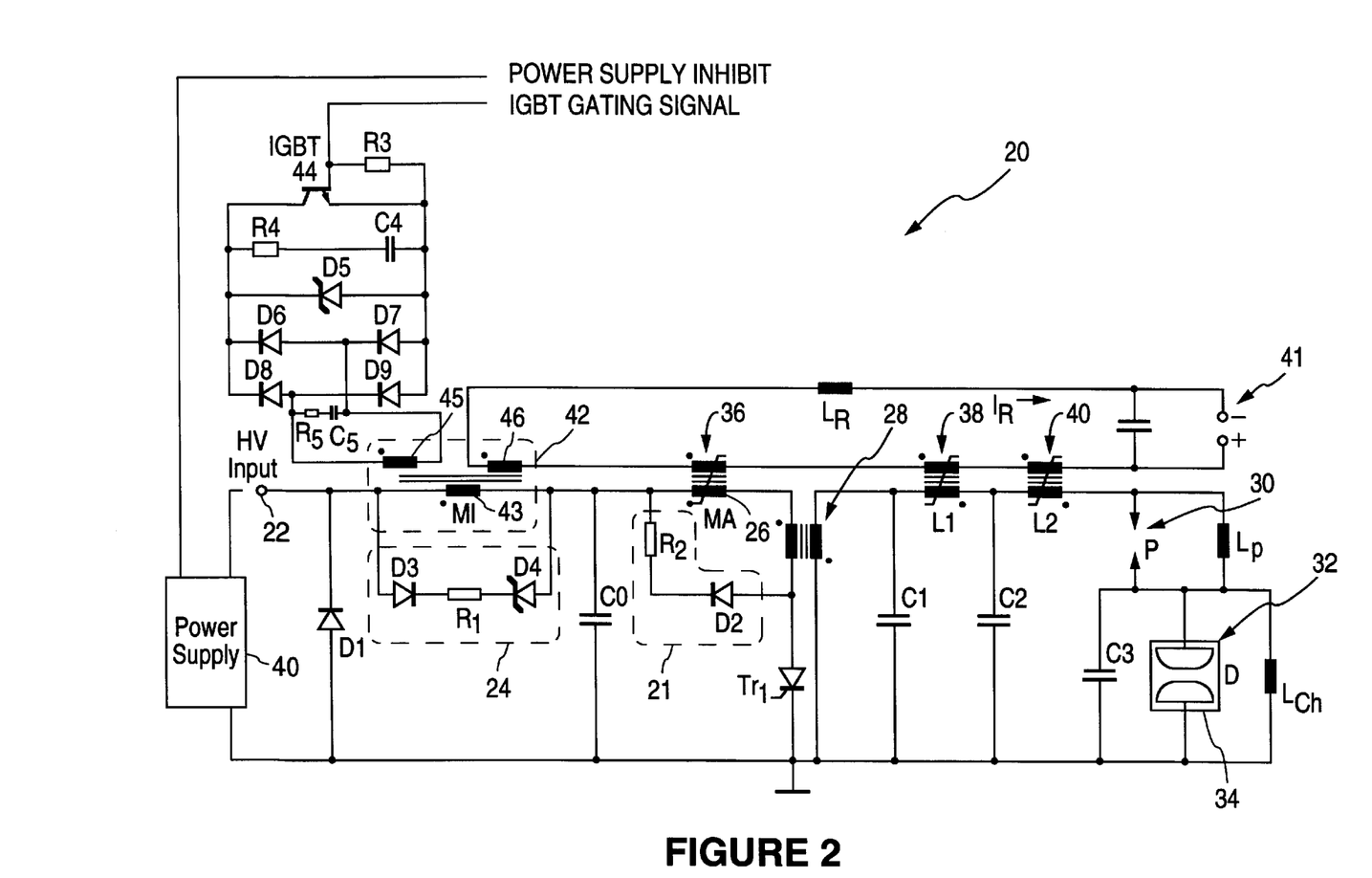
FIG. 2 is a circuit diagram of an all-solid-state switched pulser (ASSP) for the excitation of excimer lasers in accordance with the present invention.

An all-solid-state switched pulser (ASSP) 20 constructed in accordance with the present invention for the excitation of excimer lasers will now be discussed. The circuit diagram of the pulser 20 is shown in FIG. 2. Initially the primary storage capacitor $C_0$ is charged by a switched mode power supply 40, connected to the high voltage input 22 terminal, through the primary winding 43 of the magnetic switch controlled isolator (MI) 42. When the desired charging voltage on $C_0$ has been reached, thyristor, $Tr_1$, is triggered and the energy stored in $C_0$ is resonantly transferred through the magnetic assist (MA) 26 and the pulse transformer 28 to capacitor $C_1$. The switched voltage in the primary loop of the pulse transformer 28 is of the order of 2 kV, which is stepped up on the secondary winding to 20 kV, which is the voltage level required to switch the laser.

The MA 26 consists of a saturable inductor, which is initially reverse biased to provide a hold-off time during which the current flow through the thyristor is delayed to enable carrier diffusion spreading. This results in an increased current rise capability of the thyristor when MA is driven into saturation, allowing the full current to flow. The MA delays the current flow by virtue of the fact that it, in its unsaturated state, initially introduces a large inductance in series with the thyristor. It then goes into saturation, allowing a large current flow through its small saturated inductance. The primary pulse transfer time is of the order of 4 μs which is reduced by two pulse compression stages, consisting of $C_1$-$L_1$-$C_2$ and $C_2$-$L_2$-$C_3$, to a pulse time of 100 ns, resulting in a voltage rise time over the discharge electrodes of 100 ns. The laser is preionized during the charging phase of capacitor $C_3$ by a spark gap array 30, which carries the charging current. The fast rising voltage pulse on $C_3$ breaks down the discharge gap 34 of the laser 32 and the energy stored on $C_3$ is deposited into the discharge gap. The inductors $L_{CH}$ and $L_p$ are necessary for providing a current path for the leakage current through inductors $L_1$ and $L_2$ used to drive $L_1$ and $L_2$ into saturation. $L_{Ch}$ is also necessary to ensure that the capacitor $C_3$ returns to ground potential after a discharge.

Imperfect impedance matching between the pulse compression circuit and the discharge gap 34 results in voltage reversal on $C_3$, which is transmitted through the pulse compressor and pulse transformer 28 in reverse direction, causing in time succession the voltages on $C_2$, $C_1$ and $C_0$ to be inverted. The snubbing circuit 21 on the pulse transformer primary loop, consisting of $D_2$ and $R_2$ will connect a negative voltage on $C_0$ directly to the thyristor $Tr_1$ and will protect the thyristor against load faults by absorbing part of the reflected energy which could otherwise result in catastrophic failure of the switching thyristor, $Tr_1$.

The MA and inductors $L_1$ and $L_2$ are reset into reverse saturation by a dc bias current $I_R$ through auxiliary secondary reset windings 36, 38, and 40. The polarity indications on MA, $L_1$ and $L_2$ inductors indicate the current flow direction. The polarity of MA is different from that of $L_1$ and $L_2$ since the pulse transformer 28 inverts the positive polarity as indicated on the primary and secondary windings of the pulse transformer 28. (The polarity indications, are used in a manner consistent with standard practice. Specifically, polarity indications on the transformer symbols indicate the relationship between current flow in one winding and the induced current in the second winding.) The $I_R$ current is supplied by the biasing circuit 41. The biasing current is mainly important for the correct operation of the pulse compressor in forward direction, while the compressor is automatically biased for correct operation in the reverse direction. Such biasing is well known in the art. See Melville, 1951, "The use of saturable reactors as discharge devices for pulse generators."

The negative voltage building up on $C_0$ can be partly due to energy reflected back from the spark gap array 30, the discharge gap 34 and a mismatch between $C_0$ and $C_1$. Negative voltages of typically a few hundred volts are reached on $C_0$. A negative voltage on $C_0$ is desirable because this negative voltage aids in the commutation of the switching thyristor.

However, the inverse voltage on $C_0$, on the power supply 40 side causes a positive current through the components of the power supply connected to the input terminal 22 which partially discharges $C_0$. This current has to be limited in order to avoid overloading of the components of the power supply 40. The current could be reduced to a safe value by introducing a charging and isolation resistor between power supply and $C_0$. This, however, would cause unacceptably high losses during the charging cycle. Various combinations of charging inductors and parallel resistors could also be employed but it was found that a charging inductor of a suitable value to protect the power supply, interferes with the voltage regulation of the power supply, resulting in poor shot to shot voltage stability. Even a remote voltage sensor on $C_0$ tends not to improve voltage regulation because of the high impedance introduced between power supply and capacitor $C_0$ which prevents fast capacitor charging required for kHz operation.

Figure 4:
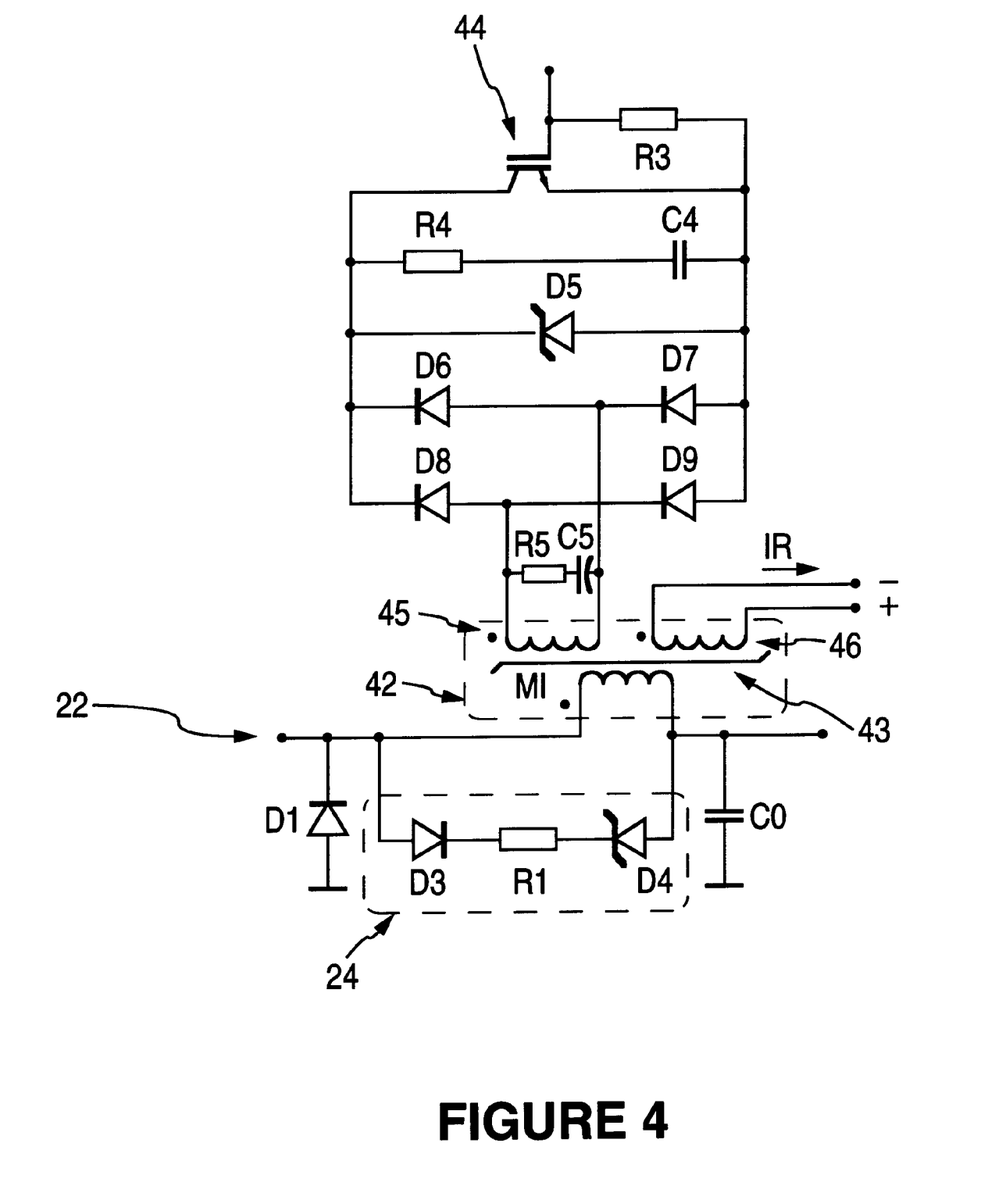
FIG. 4 shows the magnetic switch controlled isolator (MI) drive circuit of FIG. 2 in greater detail.

The ideal charging element will have a low impedance during the charging cycle, reducing charging losses and enabling voltage regulation, and a high impedance during the pulsing cycle, effectively isolating power supply and load. Such an element is provided by this invention using a controlled magnetic isolator (MI) 42 as shown in FIG. 2 and FIG. 4.

The MI 42 utilizes a toroidal magnetic core with a primary winding 43 in series with the power supply 40, and a secondary winding 45 which is switched by an IGBT 44 semiconductor switching element. An additional single turn bias winding 46 in series with the dc reset circuit is also employed.

Figure 3:
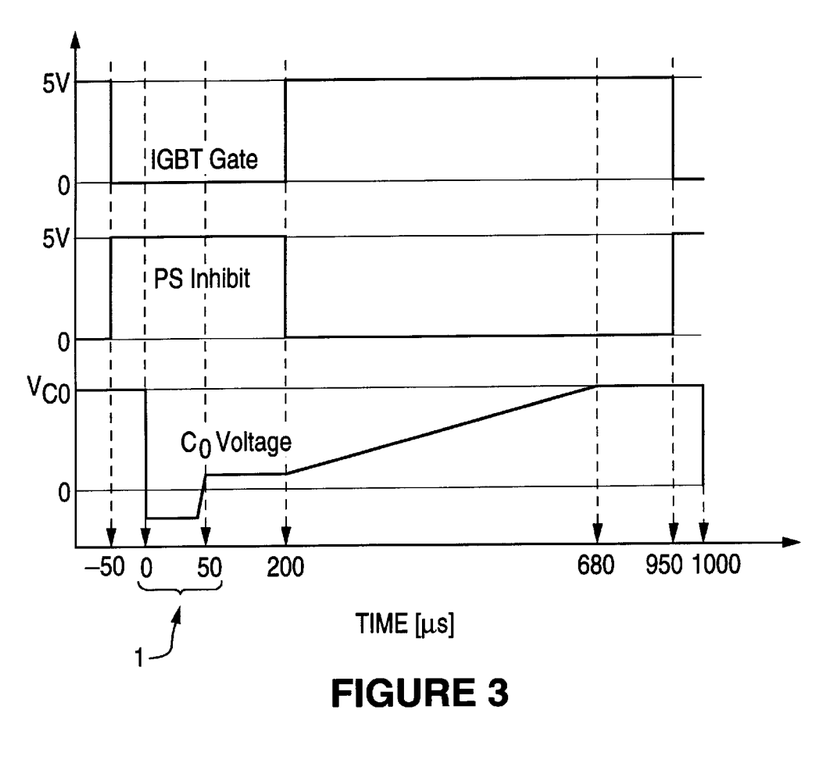
FIG. 3 is a timing diagram for the IGBT drive relative to the charging and discharging of the capacitor $C_0$ in accordance with the present invention.

The operation of the circuit can be understood from the schematic IGBT timing diagram depicted in FIG. 3. The laser controller (not shown) switches the IGBT 44 to the off-state 50 μs prior to the application of the trigger pulse to the thyristor $Tr_1$ at t=0, coinciding with the inhibit signal applied to the power supply, which stops the charging cycle of $C_0$. This effectively open-circuits the secondary winding 45 of the MI so that the power supply sees the high inductance of the primary winding 43, effectively isolating power supply and pulser. The IGBT 44 is then switched to the on-state at the same time or shortly before the inhibit signal is removed to enable the power supply to charge the capacitor.

During the primary energy transfer from $C_0$ to $C_1$ the voltage on $C_0$ is inverted to a negative voltage of a few hundred volts. This takes place during time span 1, from 0 to 50 μs. The negative voltage on $C_0$ appears over the primary winding 43 of the reverse biased MI 42 and the thyristor $Tr_1$. The MI has been designed for a hold-off time of 50 μs, during which $Tr_1$ is reversed biased, a time period which is sufficient even at high repetition rates, to safely commutate the employed fast recovery thyristor switch $Tr_1$. If alternative higher power devices are employed, the MI 42 can be designed for increased hold-off, giving the switch more time for recovery. When MI 42 saturates approximately 50 μs after the primary energy discharge from $C_0$ at t=0, the inductance of winding 43 drops from a high unsaturated value to the low saturated value allowing the voltage on $C_0$ to invert to a positive value through diode D1 and winding 43.

The design parameters for the hold-off time are: the core material; the cross sectional area; and the number of turns. The hold-off time can be calculated with the formula:

$$\int V\, dt = N A_{eu} \Delta B$$

Where V is the applied voltage, N is the number of turns, B is the magnetic flux density of the material, and $A_{eu}$ corresponds to the cross sectional area. The design of inductors for predetermined hold-off is well known and is described by Melville, 1951.

The laser controller (not shown) switches the IGBT 44 to the on-state slightly before the removal of the inhibit signal from the power supply, enabling the charging cycle. The inhibit signal is generated in the control electronics. Since the time duration during which the inhibit signal is applied to the power supply is significantly longer than that necessary for commutation of Tr1, a fixed timing, independent of repetition rate, can be used. The IGBT 44 now effectively short-circuits the secondary winding 45 of the MI 42 so that the power supply 40 only sees the small leakage inductance of the primary winding 43 of approximately 50 μH or less which does not impede the charging process.

In FIG. 2, the snubber circuit 24, which is connected across the primary coil 43 of the MI 42 consists of $D_3$, $R_1$ and $D_4$. The snubber circuit 24, diode $D_5$, and the RC-combination $C_5$, $R_5$ serve to protect the IGBT 44 from over voltage spikes. $D_6$–$D_9$ act as a bridge rectifier to ensure always the correct polarity for the IGBT. The resistors $R_3$ and $R_4$ and capacitor $C_4$ protect the IGBT.

The Diode $D_1$ is in parallel to the power supply to ensure that the inverted voltage on $C_0$ does not cause a large forward current from the power supply, which could damage its output diodes.

Figure 5:
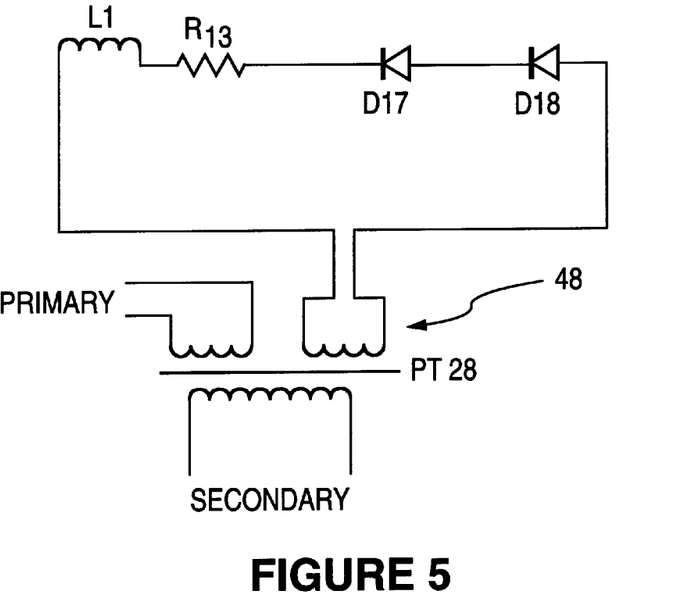
FIG. 5 shows an alternative embodiment of the pulse transformer shown in FIG. 2.

FIG. 5 shows an alternative embodiment of the pulse transformer 28. In this embodiment the pulse transformer has an auxiliary third winding 48 with five turns. A voltage clamping circuit consisting of $L_{10}$, $R_{13}$ and diodes $D_{17}$ and $D_{18}$ is connected across winding 48 which serves to absorb part of the reflected energy which in the case of load failure could damage thyristor Tr1.

Figure 6:
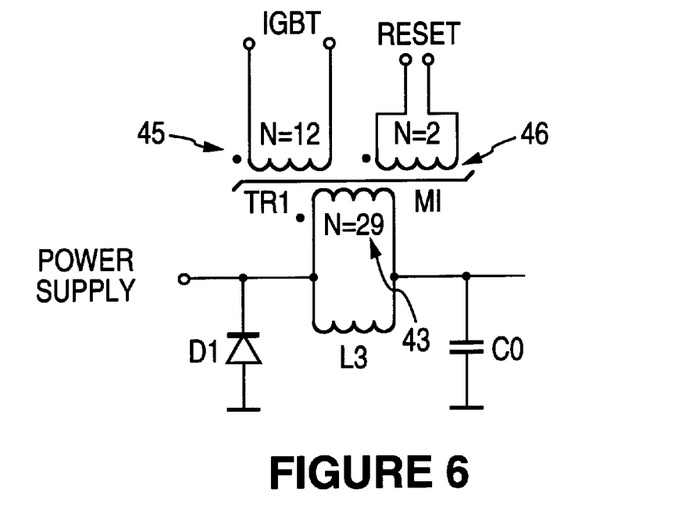
FIG. 6 shows an alternative embodiment of the magnetic switch controlled isolator.

FIG. 6 is an alternative embodiment of the MI 42. In this embodiment the configuration of the windings 43, 45 and 46 is the same, but an inductor $L_3$ is added in parallel with the coil 43. In practice it is found, that the magnitude of negative voltage on $C_0$ depends on the charging voltage, as well as load conditions. At small charging voltages the negative voltage can become very small, resulting in a hold-off voltage of the MI larger than the power supply inhibit time. This can result in incomplete resetting of the MI for the following discharge and with it unstable pulser operation. This can be avoided by adding inductor $L_3$ in parallel with the coil 43. The additional inductor $L_3$ limits the commutation time to a maximum value determined by $L_3$ and $C_0$ which can be tuned for a duration less than the power supply inhibit time. A similar effect, without the addition of inductor $L_3$, can also be obtained by employing a magnetic core with air gap or by using a magnetic material with smaller unsaturated permeability, both effectively reduce the unsaturate inductance of the MI, 42.

The pulser 20 is operated typically with a charging voltage of 2 kV on $C_0$ corresponding to a stored primary energy of approximately 3 J and a repetition rate of up to 1000 Hz. Typical parameters for the MI under these conditions are as follows:

| | |
|---|---|
| Magnetic core material: | Vacuum Schmelze VAC 6030 Z amorphous ribbon core. |
| Core dimensions: | 90 mm OD, 30 mm ID and 25 mm height. |
| Number of primary turns: | 30 |
| Secondary turns (IGBT): | 12 |
| Number of reset turns: | 1 |

The MI is not limited to the above operating conditions and can be applied successfully to higher energies and higher repetition rates. A circuit operated at a charging voltage of 2 kV with a stored primary energy of 30 J and a repetition rate of more than 500 Hz can be handled with a similar MI to effect power supply pulser isolation, semiconductor switch commutation and energy recovery. The negative hold-off of the MI can be matched to the reverse recovery time of the semiconductor switch employed over a wide range, which is only limited by the repetition rate and the time required to charge capacitor $C_0$. Maximum hold-off times of 250 μs should be sufficient under all conditions, even for relatively slow high voltage devices.

The functions of power supply pulser isolation and semiconductor switch commutation-enhancement, which are effected by the described MI element have previously been carried out by separate and different circuit elements, although with a lesser degree of control.

Negative voltage snubbing of $C_0$ has often been carried out with dissipative elements thereby wasting the energy stored in the negative charge of $C_0$. See, A. L. Keet and M. Groeneboom, 1989, "High Voltage Solid-State Pulser for High Repetition Rate Gas Laser," EPE conference, Aachen; and U.S. Pat. No. 5,177,754, "Magnetic Compression Laser Driving Circuit". Power supply pulser isolation has generally been carried out using series charging inductors or resistors with the associated disadvantages described above. Additional high voltage switches inserted between power supply and pulser lead to added circuit complexity and can fail under fault conditions. Accurate control of the negative voltage phase on $C_0$ to aid switch commutation is generally a complex issue, especially under high repetition rate operation of the laser.

The present invention has several inherent advantages over the previously employed techniques. The present invention provides a single circuit which facilitates both power supply isolation and semiconductor switch commutation enhancement. The inductance of the MI 42 can be made of passive elements with their associated high reliability and resistance to damage under circuit fault conditions. The active control element, the IGBT 44 semiconductor switch, is galvanically uncoupled from the main high voltage circuit, making its protection easy. The on-off ratio of unsaturated inductance and leakage inductance can be made very high, resulting in an efficient charging cycle and high power supply pulser isolation during the switching cycle. The duration of the negative voltage applied to the thyristor for commutation can be controlled accurately and matched to the employed semiconductor switch, which is important for high repetition rate applications.

Various other modifications and alterations in the structure and use of this invention will be apparent to those skilled in the art without departing from the scope and spirit of the invention. Although the invention has been described in connection with a specific preferred embodiment, it should be understood that the invention as claimed should not be unduly limited to any specific embodiment. It is intended that the following claims define the scope of the present invention and that structures and methods within the scope of these claims and their equivalents be covered thereby.

What is claimed is:

1. An apparatus for supplying pulse power comprising:
   a power supply for providing a voltage to a capacitor;
   a first switch, wherein the capacitor discharges energy in response to the closing of a first switch;
   a pulse compression circuit having a plurality of stages for receiving and transmitting energy discharged from the capacitor;
   a pulse transformer for stepping-up the voltage applied to the pulse compression circuit; and
   means connected across the pulse transformer for absorbing energy reflected back from the pulse compression circuit as a result of impedance mismatch between adjacent stages of the pulse compression circuit.

2. The apparatus for supplying pulse power as in claim 1, wherein the first switch is a semiconductor switch.

3. The apparatus for supplying pulse power as in claim 2, wherein the first switch is a thyristor.

4. The apparatus as in claim 3, further comprising a means for delaying the delivery of energy from the capacitor to the pulse compression circuit after the first switch has been closed, whereby carrier diffusion in the first switch is increased which results in an increased current rise capability in the first switch.

5. The apparatus as in claim 4, wherein the energy delivered from the capacitor is passed through the pulse compression circuit and a portion of the energy delivered from the capacitor is reflected by the pulse compression circuit and the load, wherein the reflected portion of the energy is stored in the capacitor and commutates the first switch.

6. The apparatus as in claim 5, further comprising:
   a pulse transformer, wherein the energy stored in the capacitor is discharged through the pulse transformer to the pulse compression circuit.

7. The apparatus as in claim 1, wherein said energy absorbing means comprises a circuit connected over the pulse transformer to bring a negative potential of the capacitor to the thyristor and to dissipate energy reflected back from the pulse compression circuit under a load fault condition.

8. An apparatus for supplying pulse power comprising:
   a power supply for providing a voltage to a capacitor;
   a first switch, wherein the capacitor discharges energy in response to the closing of a first switch;
   a pulse compression circuit for receiving and transmitting energy discharged from the capacitor;
   a pulse transformer for stepping-up the voltage applied to the pulse compression circuit; and
   a circuit connected over the pulse transformer to bring a negative potential of the capacitor to the thyristor and to dissipate energy reflected back from the pulse compression circuit under a load fault condition.

9. An apparatus for transmitting energy from a power supply to a laser comprising:
   a capacitor for storing and discharging electrical energy;
   a first switch, wherein energy is discharged from the capacitor to the laser in response to a closing of the first switch; and
   a pulse compression circuit including a plurality of stages for receiving and transmitting energy discharged from the capacitor;
   a pulse transformer for stepping-up the voltage applied to the pulse compression circuit; and
   a snubbing circuit connected across the pulse transformer for absorbing energy reflected back from the pulse compression circuit as a result of impedance mismatch between adjacent stages of the pulse compression circuit.

10. The apparatus for supplying a pulse of energy as in claim 9, wherein the laser converts a first portion of the energy discharged by the capacitor to light, and reflects a second portion of the energy back to the capacitor, wherein the energy reflected back to the capacitor is stored in the capacitor and commutates the first switch thereby creating an open circuit.

11. A method for supplying pulse power comprising the steps of:
   charging a capacitor when a first switch is open;
   discharging energy from the capacitor in response to closing of a first switch;
   transmitting said energy successively through a plurality of stages of a pulse compression circuit; and
   dissipating in a snubbing circuit connected across a pulse transformer energy reflected back from the pulse compression circuit as a result of impedance mismatch between adjacent stages of the pulse compression circuit.

12. The method of claim 11, further comprising the step of magnetically isolating a power supply from the pulse compression circuit when the first switch is closed.

13. The method as in claim 12, further including a step of closing a second switch to enable the flow of energy from the power supply to the capacitor when the first switch is open.

14. The method as in claim 13, further including a step of opening the second switch which causes the magnetic isolation of the power supply.

15. The method as in claim 14, further including the step of delaying energy discharged from the capacitor after the closing of the first switch, whereby charge diffusion in the first switch increases and results in an increased current rise capability in the first switch.

16. The method as in claim 15, further including the step of transmitting the energy discharged from the capacitor through the pulse compression circuit and reflecting a portion of the energy delivered from the capacitor back to the capacitor, wherein the reflected portion of the energy is stored in the capacitor and opens the first switch.

17. A method for transmitting energy from a power supply to a laser comprising the steps of:

storing electrical energy in a capacitor;

closing a first switch;

discharging electrical energy from the capacitor in response to the closing of the first switch; and dissipating in a snubbing circuit connected across a pulse transformer energy reflected back from the pulse compression circuit as a result of impedance mismatch between adjacent stages of the pulse compression circuit.

18. The method of claim 17, further comprising the step of magnetically isolating the power supply from the laser when the first switch is closed.

19. The method for transmitting energy as in claims 18, further comprising the steps of:

converting a first portion of the electrical energy discharged from the capacitor to light; and storing a second portion of electrical energy reflected by the laser in the capacitor, wherein the energy reflected back to the capacitor commutates the first switch thereby creating an open circuit.

20. An apparatus for receiving energy transmitted by a power supply and pulsing the received energy to a laser, comprising:

a capacitor for storing energy transmitted by the power supply;

a pulse compression circuit for receiving and transmitting energy discharged from the capacitor;

a first switch which controls the discharge of energy from the capacitor to the pulse compression circuit;

a pulse transformer for stepping up a voltage applied from the capacitor to said pulse compression circuit and ultimately to the laser; and a snubbing circuit connected across the primary loop of the pulse transformer to dissipate energy reflected back from the pulse compression circuit as a result of impedance mismatch between adjacent stages of the pulse compression circuit.

21. The apparatus of claim 20, further comprising a magnetic isolator between the power supply and the capacitor, selectively operable during discharge of energy from the capacitor to the pulse compression circuit.

22. The apparatus for supplying pulse power as in claim 20, wherein the first switch is a solid-state device.

23. The apparatus for supplying pulse power as in claim 20, wherein the first switch is a thyristor.

24. The apparatus for supplying pulse power as in claim 21, wherein the magnetic isolator includes:

a primary winding about a magnetic core, wherein the primary winding is in series with the power supply; and a secondary winding with a second switch attached thereto, wherein the closing of the second switch short-circuits the secondary winding such that an inductance of the primary winding does not inhibit the charging of the capacitor.

25. The apparatus as in claim 24, wherein the inductance of the primary winding isolates the power supply from the magnetic pulse compression circuit when the second switch is open.

26. The apparatus as in claim 25, further comprising means for delaying the delivery of energy from the capacitor to the magnetic pulse compression circuit after the first switch has been closed, whereby carrier diffusion in the first switch is increased which results in an increased current rise capability in the first switch.

27. The apparatus as in claim 20, wherein the energy delivered from the capacitor passes through the pulse compression circuit and a portion of the energy delivered from the capacitor is reflected by the pulse compression circuit and the load, wherein at least some of the reflected portion of the energy not absorbed by the snubbing circuit is stored in the capacitor and commutates the first switch.

28. The apparatus as in claim 20, wherein the snubbing circuit is connected over the pulse transformer to bring a negative potential of the capacitor to the thyristor and to dissipate energy reflected back from the pulse compression circuit under a load fault condition.

* * * * *